(12) United States Patent
Zappettini et al.

(10) Patent No.: US 7,014,702 B2
(45) Date of Patent: Mar. 21, 2006

(54) METHOD AND APPARATUS FOR PREPARATION OF BINARY AND HIGHER ORDER COMPOUNDS AND DEVICES FABRICATED USING SAME

(75) Inventors: Andrea Zappettini, Reggio Emilia (IT); Lucio Zanotti, Parma (IT); Mingzheng Zha, Parma (IT); Francesco Bissoli, Pontremoli (IT)

(73) Assignee: Pirelli Cavi e Sistemi S.p.A., Milan (IT)

( * ) Notice: Subject to any disclaimer, the term of this patent is extended or adjusted under 35 U.S.C. 154(b) by 0 days.

(21) Appl. No.: 10/296,909

(22) PCT Filed: May 30, 2001

(86) PCT No.: PCT/IB01/00836

§ 371 (c)(1),
(2), (4) Date: May 20, 2003

(87) PCT Pub. No.: WO01/92608

PCT Pub. Date: Dec. 6, 2001

(65) Prior Publication Data

US 2004/0035356 A1   Feb. 26, 2004

Related U.S. Application Data

(60) Provisional application No. 60/208,924, filed on Jun. 5, 2000.

(30) Foreign Application Priority Data

May 31, 2000  (EP)  ................................. 00304621

(51) Int. Cl.
*C30B 1/02*  (2006.01)
(52) U.S. Cl. .................... 117/2; 117/3; 117/81; 117/82; 117/83; 117/956; 117/957; 423/99; 423/508
(58) Field of Classification Search ............... 117/2, 117/3, 81, 82, 83, 956, 957; 423/99, 508
See application file for complete search history.

(56) References Cited

U.S. PATENT DOCUMENTS 4,068,253 A * 1/1978 Fujiwara et al. ............ 257/184

(Continued)

FOREIGN PATENT DOCUMENTS

EP   1 013 801   6/2000

OTHER PUBLICATIONS

Laasch et al.; "Growth of Twin-Free CdTe Single Crystals in a Semi-Closed Vapour Phase System"; Journal of Crystal Growth, vol. 174, pp. 696-707, (1997).

(Continued)

*Primary Examiner*—Robert Kunemund
(74) *Attorney, Agent, or Firm*—Finnegan, Henderson, Farabow, Garrett & Dunner, L.L.P.

(57) ABSTRACT

A heat treatment chamber (30) is provided comprising a treatment region containing a charge (5) of compound material comprising a plurality of n atomic species, each atomic species being associated with at least one gas species. The chamber (30) is placed in a furnace (7). The chamber has a gas permeable barrier, constituted by a plug (4) and wadding (6), which partially encloses the treatment region. The barrier serves as an effusive hole to inhibit, but not prevent, gas vapour release, thereby to elevate the gas vapour pressure in the treatment region. Application of inert gas through a valve (8) is also used to increase background pressure in the treatment region during heat treatment. The elevated gas pressures present in the treatment region during treatment are measurable in an absorption cell (3) adjacent to the treatment region. It is thus possible to monitor the gas pressures during heat treatment and thereby stop the heat treatment once a desired charge stoichiometry is achieved. This improves over prior art heat treatment which is carried out in vacuum and thus precludes optical absorption measurement of the gas pressures during heat treatment.

19 Claims, 5 Drawing Sheets

U.S. PATENT DOCUMENTS 4,190,486 A     2/1980   Kyle
6,299,680 B1 * 10/2001   Koyama et al. ............... 117/2

OTHER PUBLICATIONS

Junichi; "Preparation of CDTE Crystal"; Patent Abstracts of Japan, of 59-035086, Feb. 25, 1984.

Takeshi; "Production of Compound Semiconductor Single Crystal and Device Therefor"; Patent Abstracts of Japan, of 62-288187 A, Dec. 15, 1987.

Su et al.; "Vapor-Phase Stoichiomerty and Heat Treatment of CdTe Starting Material for Physical Vapor Transport"; Journal of Crystal Growth, vol. 183, pp. 519-524, (1998).

Carles et al.; "Partial Pressure Monitoring in Cadmium Telluride Vapour Growth"; Journal of Crystal Growth, vol. 174, pp. 740-745, (1997).

Su et al.; "In Situ Partial Pressure Measurements and Visual Observation During Crystal Growth of ZnSe by Seeded Physical Vapor Transport"; Journal of Crystal Growth, vol. 209, pp. 687-694, (2000).

Mochizuki; "Vapor Growth of CdTe at Low Temperatures"; Journal of Crystal Growth, vol. 73, pp. 510-514, (1985).

De Largy et al.; "Thermodynamic Functions for the Congruent Sublimation of Cadimium Telluride"; Journal of Crystal Growth, vol. 61, pp. 194-198, (1983).

C. Geibel; "Vapor Growth of CdTe as Substrate Material for $HG_{1-x} Cd_x Te$ Epitaxy"; Journal of Crystal Growth, vol. 86, pp. 386-390, (1983).

Berding; "Annealing Conditions for Intrinsic CdTe"; Applied Physics Letters, vol. 74, No. 4, pp. 552-554, (1999).

Mullins et al.; "A Novel "Multi-Tube" Vapour Growth System and Its Application to the Growth of Bulk Crystals of Cadmium Telluride"; Journal of Crystal Growth, vol. 208, pp. 211-218, (2000).

Yellin et al.; "Vapor Transport of Nonstoichiometric CdTe Closed Ampoules"; Journal of Crystal Growth, vol. 69, pp. 555-560, (1984).

* cited by examiner

METHOD AND APPARATUS FOR PREPARATION OF BINARY AND HIGHER ORDER COMPOUNDS AND DEVICES FABRICATED USING SAME

CROSS REFERENCE TO RELATED APPLICATIONS

This application is a national phase application based on PCT/IB01/00836, filed May 30, 2001, the content of which is incorporated herein by reference, and claims the priority of European Patent Application No. 00304621.6, filed May 31, 2000, the content of which is incorporated herein by reference, and claims the benefit of U.S. Provisional Application Ser. No. 60/208,924, filed Jun. 5, 2000, the content of which is incorporated herein by reference.

BACKGROUND ART

The invention relates to a method of and apparatus for processing a binary, ternary or higher order compound to improve stoichiometry. The invention further relates to fabricating a device, and to such devices.

Physical vapour transport (PVT) is a crystal growth technique used for preparing CdTe. It has been recognised that PVT of CdTe requires a highly stoichiometric starting compound, since the transport rate of the vapour species falls off rapidly as the composition of the starting compound deviates from perfect stoichiometry (see reference [1] & reference [6]). If the starting compound has perfect stoichiometry, i.e. equal amounts of the species Cd and Te, then congruent sublimation of the vapour takes place. However, as the stoichiometry deviates to either excess Cd or excess Te, the transport rates fall by orders of magnitude. If the deviation is too large, growth is completely inhibited.

The use of highly stoichiometric starting material is beneficial not only for PVT growth of CdTe but also for other materials and growth techniques, such as Bridgman, high-pressure Bridgman and Markov.

Su et al (see reference [2]) heat treat a CdTe starting compound to remove excess Te and improve the CdTe stoichiometry. Samples were heat treated, i.e. annealed, for 24 or 48 hours at 870° C. To examine the effect of the heat treatment, the CdTe stoichiometry was measured before and after heat treatment using an optical absorption technique. The optical absorption technique is described in Carles et al [3] and Mullins et al [4] where the technique is used during vapour growth. The optical absorption is used to measure the partial pressure of $Te_2$ vapour, $P(Te_2)$, while the sample is maintained at an elevated temperature of 870° C. The corresponding partial pressure of Cd, $P(Cd)$, is calculated from the stoichiometric invariant, i.e. the equation $$P(Cd)P(Te_2)^{1/2} = K(T)$$

where $K(T)$ is the equilibrium constant which depends only on temperature T. (The Cd pressure was too low to measure accurately the Cd absorption peak in the Te-rich samples used). The partial pressure ratio $P(Cd)/P(Te_2)$ is a measurement of the stoichiometry of the CdTe. If the CdTe has perfect stoichiometry, then material loss is solely by congruent sublimation which implies loss of equal amounts of Cd and Te thereby giving $P(Cd)/P(Te_2)=2$. Other Cd and Te vapour species are only present in small amounts at 870° C. and are ignored.

The optical absorption measurements showed that the as-synthesised material was in all cases Te-rich. $P(Cd)/P(Te_2)$ varied between 0.007 (highly Te rich) to 1.92 (only very slightly Te rich). After heat treatment, measured $P(Cd)/P(Te_2)$ varied between 1.84 and 3.4. In particular, the heat treatment was successful in removing the large quantities of excess Te from the highly Te-rich samples, providing material that generally has moderate excess amounts of Cd.

Heat treatment is thus shown generally to improve stoichiometry of the Te-rich as-synthesised material, although precise control of the stoichiometry is not possible. An unwanted consequence of the heat treatment is material loss of the CdTe compound. The 24 or 48 hour anneal was performed under vacuum and the material loss stated to be 'reasonable'. But, during the pre-anneal and post-anneal optical absorption measurements, which are performed under non-vacuum conditions, the required heating to 870° C. is reported to result in loss of about 10% of the CdTe in only 8 minutes. It is not possible to measure the stoichiometry during the vacuum anneal because the vapour pressures are too low.

Further heat treatment methods for CdTe are discussed by Giebel et al [8] and by Mochizuki [9].

SUMMARY OF THE INVENTION

According to a first aspect of the invention there is provided a method of heat treatment of a charge of compound material comprising a plurality of n atomic species to remove an excess of at least one of the atomic species. The method comprises: (a) heating the charge to a temperature above a melting temperature of at least one of the atomic species and below the melting temperature of the compound; (b) monitoring a gas pressure associated with one of the atomic species during the heating; and (c) controlling the heating in response to the monitored gas pressure.

By monitoring the stoichiometry of a compound during heat treatment, it becomes possible to stop the heat treatment in a controlled fashion. More specifically, there is a direct relation between current gas pressure in the annealing chamber and the current stoichiometry. Heat treatment can thus be stopped once a target stoichiometry is reached, as defined by a corresponding target gas pressure. The target value may correspond to a stoichiometric balance between the atomic species in the charge of material, or a limited excess of one species within the solubility limit for the compound concerned. The target value may be defined in terms of a gas pressure of only one gas species, or in terms of multiple gas species. The gas pressure of two or more of the atomic species may be monitored during the heating.

Preferably, the charge is at least partially enclosed to inhibit loss of the compound material and to elevate the gas pressure for the monitoring. The pressure may also be elevated by applying an inert gas to the charge, this also serving to inhibit loss of the compound material.

In an embodiment of the invention, the gas pressure is monitored by an optical absorption method the carrying out of which is facilitated by elevated pressure of the monitored gas species.

According to a second aspect of the invention there is provided a method of growing a crystalline compound, comprising: annealing a charge of material comprising a plurality of n atomic species according to the heat treatment method of the first aspect; placing the annealed charge into a growth chamber; and growing a crystalline compound incorporating material from the annealed charge.

According to a third aspect of the invention there is provided a method of fabricating a device, comprising: growing a crystalline compound according to the second aspect; and fabricating a device from the crystalline compound.

According to a fourth aspect of the invention there is provided a device fabricated according to the third aspect of the invention.

According to a fifth aspect of the invention there is provided a heat treatment chamber comprising: a treatment region containing a charge of compound material comprising a plurality of n atomic species, each atomic species being associated with at least one gas species; and a gas permeable barrier at least partially enclosing the treatment region, the barrier being sufficiently permeable to passage of the gas species from the charge, but sufficiently resistive to elevate the gas vapour pressure of at least one of the gas species in the treatment region.

The heat treatment chamber may be provided in combination with a measurement chamber arranged in gaseous communication with the heat treatment chamber.

According to a sixth aspect of the invention there is provided a heat treatment apparatus comprising: a heat treatment chamber having a treatment region in which a charge of compound material comprising a plurality of n atomic species can be placed for heat treatment, each atomic species being associated with at least one gas species, the treatment region being at least partially enclosed by a gas permeable barrier for elevating the gas vapour pressure of at least one of the gas species in the treatment region; a measurement device for measuring gas vapour pressure of at least one of the gas species in the treatment region; a furnace for heating the heat treatment chamber; and a control device operable to control the furnace responsive to a vapour pressure signal of at least one of the gas species from the measurement device.

The measurement device may include a measurement chamber in gaseous communication with the treatment region of the heat treatment chamber.

The furnace preferably has first and second zones maintainable at different temperatures. In operation, the measurement chamber is arranged in the first zone and the heat treatment chamber is arranged in the second zone.

The measurement chamber may include an optical access so that the measurement device can measure gas pressure by optical absorption in the measurement chamber.

The control device is preferably operable to maintain the heat treatment chamber at an elevated temperature until a target value of the gas pressure is measured by the measurement device. The target value is defined by a vapour pressure of at least one of the gas species. The target value may also be defined by a ratio of vapour pressures of two of the gas species.

In an embodiment of the invention, the pressure of both Cd and $Te_2$ vapours emitted from a CdTe charge were monitored during heat treatment to provide a real time monitoring of the effective stoichiometry of the charge. In this way, the heat treatment can be stopped at a point at which a desired target stoichiometry is reached. The target stoichiometry may be perfect stoichiometry, i.e. equal amounts of Cd and Te in the CdTe compound, or may be a desired excess of one or other of Cd or Te.

Under the conditions of the heat treatment used in the embodiment, tellurium vapour is known to consist of more than 95% diatomic molecules. Other tellurium gas species could therefore be ignored.

BRIEF DESCRIPTION OF THE DRAWINGS

For a better understanding of the invention and to show how the same may be carried into effect reference is now made by way of example to the accompanying drawings in which.

DETAILED DESCRIPTION

A controlled heat treatment method and apparatus for producing material of any desired stoichiometry is now described.

Figure 1:
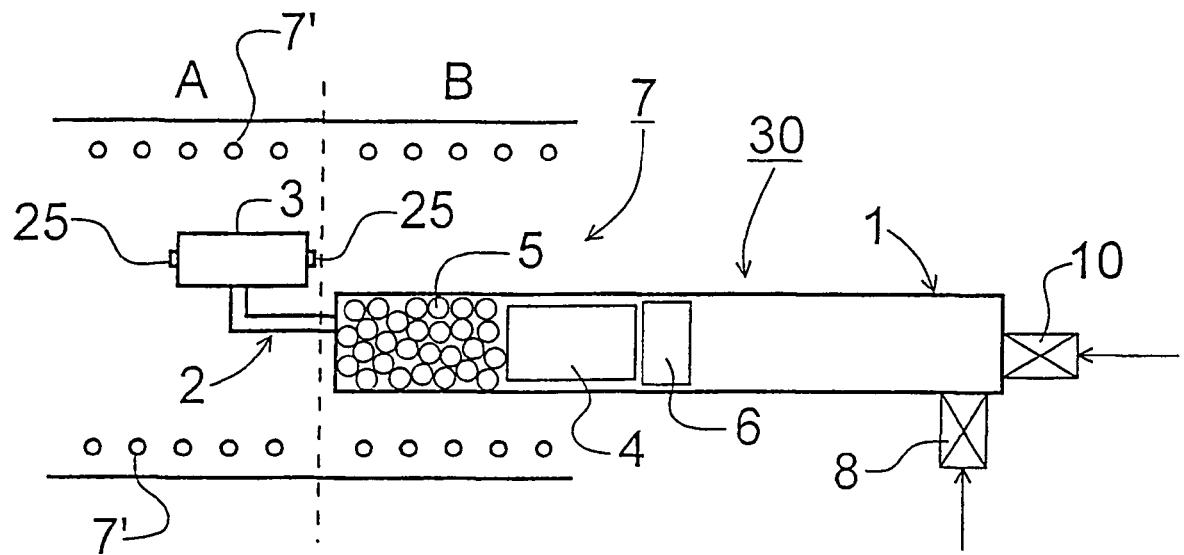
FIG. 1 shows a heat treatment chamber arranged in a two-zone furnace.

FIG. 1 shows a heat treatment chamber 30 arranged in a two-zone furnace 7.

The two-zone furnace 7 is generally tubular in cross-section and approximately 50 cm long. The furnace 7 has heating coils 7'. The heating coils 7' may be resistive or inductive. The heating coils 7' are subdivided into two individually controllable groups arranged lengthwise along the furnace 7 to define two heating zones, designated Zone A and Zone B. In these zones, the temperature may be individually set using temperature controllers (not shown).

The heat treatment chamber 30 has a body 1 which is generally tubular in cross-section and made of quartz. At one end of the chamber body 1, a capillary tube 2 leads to an optical measurement cell 3. The capillary tube 2 is a simple small diameter tube. The optical measurement cell 3 is provided with access windows 25 facing each other to allow passage of a light beam through the cell 3. At the other end of the chamber body 1 there is provided a pair of valves. One valve 10 leads to a vacuum pump (not shown) for evacuating the chamber 30. The pump and other vacuum components preferably do not use oil in order to reduce contamination. The pump may be a turbomolecular pump. Another valve 8 is used to introduce inert gas into the chamber 30 from a remote inert gas supply (not shown). The interior of the chamber body 1 is divided into two by a cylindrical plug 4 made of quartz. Quartz wool, which acts as wadding 6, is placed behind the plug 4. To the left of the plug 4, as viewed in FIG. 1, there is shown a charge 5 of material for heat treatment.

The dimensions of the parts were as follows. The chamber body 1 comprises a 25 cm long tube of 3 cm diameter. The plug 4 is 3 cm long. The cell 3 comprises a tube of 5 cm in length and 1 cm in diameter. The inner diameter of body 1 is less than 2 mm greater than the outer diameter of the plug 4. Typically the spacing between the outer surface of the plug 4 and inner surface of the body 1 may be 0.5 to 1 mm.

To load material for heat treatment, the charge 5 is placed into the chamber body 1 towards the end adjacent the capillary tube 2. The plug 4 is then inserted to the position shown in FIG. 1. Next, the wadding 6 is placed behind the plug 4. Placing the wadding 6 behind the plug 4 has the effect of decreasing the effective gap between plug 4 and chamber body 1. Good reproducibility was achieved with a thickness of 5 cm or more for the quartz wool wadding. Without the quartz wool wadding, the barrier provided by the plug would only have around a 0.5 mm dimension which is larger than the mean free path of the Cd atoms and $Te_2$ molecules at the working pressures. A significant pressure enhancement effect would then not occur. More generally, the barrier for inducing effusive flux, however fabricated, will need to have a characteristic dimension approximately equal to or less than the mean free paths of the relevant gas species under anneal conditions.

The heat treatment chamber 30 loaded with the charge 5 is then placed in the furnace 7 ready for heat treatment. During heat treatment, atomic or molecular vapours (e.g. Cd and $Te_2$ vapours for CdTe charge) pass to the optical measurement cell 3 through the capillary tube 2. The placement of the heat treatment chamber 30 is such that the charge 5 lies in Zone B and the measurement cell 3 lies in Zone A, as illustrated. This allows the optical measurement cell 3 to be maintained at a temperature a few degrees higher than the charge 5 in the chamber body 1 (e.g. $\Delta T=5°$ C.) to avoid deposition of material on the windows 25.

Figure 2:
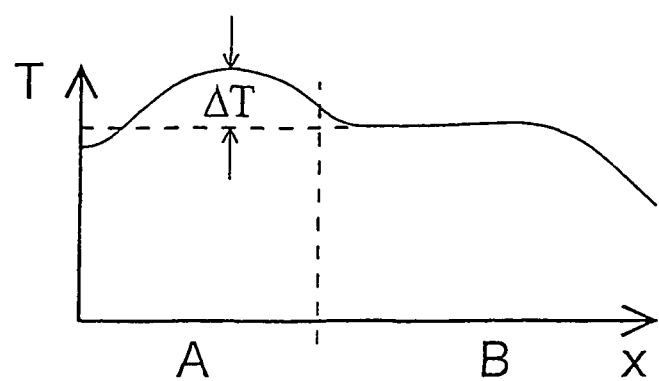
FIG. 2 shows a temperature profile across the two-zone furnace of FIG. 1.

FIG. 2 shows schematically the temperature profile across Zone A and Zone B during heat treatment (T v. x). As can be seen, Zone B is controlled so that a substantially flat temperature profile is maintained across the charge 5, with Zone A being controlled to provide an elevated temperature in the measurement cell 3.

Because the temperature difference between cell 3 and body 1 is only small, the partial pressure in the optical measurement cell 3 is substantially the same as in the region surrounding the charge 5. Optical absorption measurements made by a light beam traversing the cell 3 through its windows 25 can thus provide sufficiently accurate partial pressure readings of one or more vapour species emitted from the charge.

Figure 3:
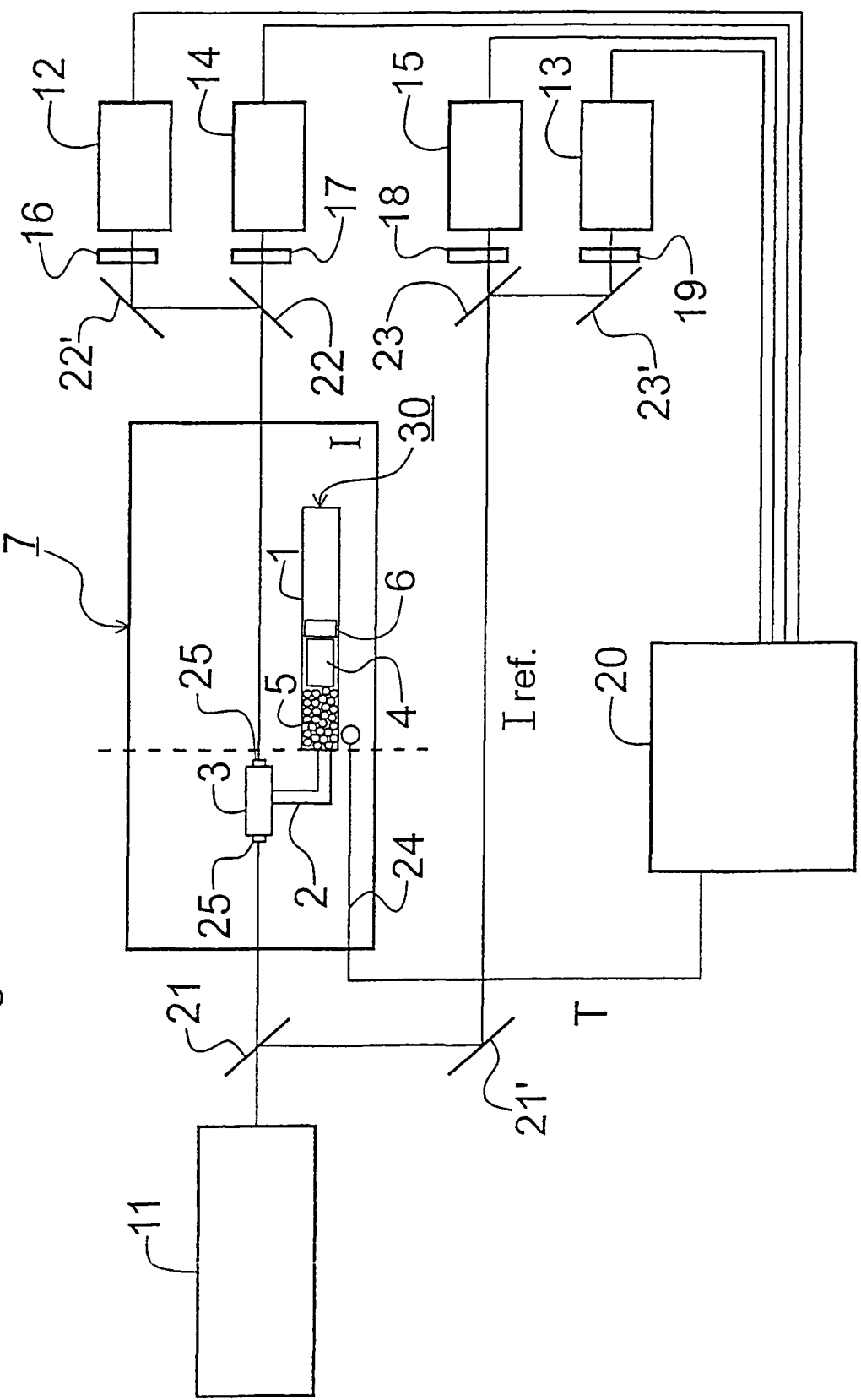
FIG. 3 shows a system incorporating the heat treatment chamber and two-zone furnace of FIG. 1.

FIG. 3 shows the heat treatment chamber 30 and furnace 7 already described with reference to FIG. 1 within an overall system including further components associated with the optical absorption measurement, temperature sensing and control.

A temperature sensor in the form of a thermocouple 24 is placed in the furnace 7 adjacent to the CdTe polycrystals 5 in the heat treatment chamber 30.

The general arrangement used for the optical absorption measurements is now described. A light source is arranged to direct a light beam through the optical measurement cell. The light beam enters and exits the cell through the cell windows. The light source is selected so that it produces light at a wavelength where the vapour species of interest has some absorption, preferably strong absorption. If two or more co-existing vapour species are to be measured, the respective wavelengths are preferably chosen so that absorption of each wavelength is predominantly caused by only one of the co-existing vapour species. A part of the light beam is split off before entering the cell, to provide a reference beam to compare with the other part of the beam which traverses the cell, referred to as the measurement beam in the following. The degree of absorption of the measurement beam in the cell is measured by comparing the respective intensities of the reference and measurement beams with a suitable photodetector or photodetectors, such as photomultiplier tubes, semiconductor diodes, charged-coupled display devices, etc.

Referring to FIG. 3, there is shown a measurement set-up suitable for measuring absorption of two vapour species, more specifically Cd and $Te_2$. A laser 11 is arranged to direct a laser beam directly through the cell 3, in and out of respective ones of the windows 25. For measuring absorption of Cd and $Te_2$ a commercially available helium-cadmium (He—Cd) laser is used. A He—Cd laser has lasing wavelengths at 325 nm and 442 nm. The 325 nm laser line is strongly absorbed by Cd vapour, and the 442 nm laser line is strongly absorbed by $Te_2$ vapour. The use of a laser source makes the optical system easy to align, even if quite a long furnace is used. However, in general, a non-laser light source may be used, for example a discharge lamp.

The specific optical arrangement for routing the beams is now described. However, any number of optical arrangements could be envisaged. The laser 11 is optically coupled to a beam-splitter 21 arranged to divide an incoming beam into two beams. The transmitted part forms the measurement beam that passes through the cell 3 and the reflected part forms the reference beam. The reference beam is directed to a mirror 21' which deflects it to a further beam splitter 23. The part of the reference beam transmitted by the beam splitter 23 passes through a 325 nm band-pass filter 18 to a photodetector 15 responsive to that wavelength. The part of the reference beam reflected by the beam splitter 23 passes through a 442 nm band-pass filter 19, via a mirror 23', to a photodetector 13 responsive to that wavelength. Going back to the measurement beam, after traversing the cell 3, it is received by a beam splitter 22. A transmitted part of the measurement beam then passes through a 325 run band-pass filter 17 to a photodetector 14 responsive to that wavelength. The part of the reference beam reflected by the beam splitter 22 passes through a 442 nm band-pass filter 16, via a mirror 22', to a photodetector 12 responsive to that wavelength. For detecting 442 nm light, the detectors 12 and 13 may be silicon photodiodes made by Hamamatsu (Japan) model S1227-1010BR. For detecting 325 nm light, the detectors 14 and 15 may be silicon photodiodes made by Hamamatsu (Japan) model S1227-1010BQ. It will also be appreciated that the band-pass filters 16–19 may be replaced with other filters, e.g. cut-off filters.

The use of filters 16–19, and also beam splitters and mirrors 22,22',23, 23' is specific to applications which use a single light beam containing multiple wavelengths. If separate source beams are used for each wavelength, or if only one vapour species is to be measured, these components could be omitted.

The system is controlled by a control device in the form of a personal computer 20. The personal computer 20 is connected to receive input signals from the photodetectors 12–15. More specifically, the personal computer 20 has a data acquisition board (not shown) with inputs connected by signal lines to outputs of each of the four photodetectors 12–15. The data acquisition board is operable to deliver data readings of the light signal intensity periodically, with a sampling frequency of 10 Hz. The partial pressures are calculated by the personal computer 20 in real time from the light intensity signals from the photodetectors. The vapour pressures inside the cell 3 can thus be determined every 0.1 sec. In addition, the personal computer 20 is connected to the thermocouple 24 so that the temperature of the charge 5 can also be monitored by the personal computer 20.

To improve signal-to-noise ratio, standard lock-in detection techniques may be used, for example with an optical chopper being placed in the laser beam path.

The origin of the relationships used to calculate the partial pressures of the vapour species from the optical absorption measurements is now described with reference to the example of Cd and $Te_2$. The same methodology can be applied equally well to other vapour species.

The system is calibrated by monitoring, as a function of temperature, the absorption of the 325 nm laser line by Cd vapour in a chamber containing only cadmium vapour. The same procedure is repeated for tellurium by monitoring the absorption of the 442 nm line by $Te_2$ vapour in chambers containing only tellurium vapour. This calibration serves to determine the relation between the optical absorption and the pressure for each vapour species of interest. Moreover, the calibration can take into account any optical absorption of one vapour species at a wavelength where the predominant absorption is from another vapour species. Specifically, the calibration for CdTe takes into account the fact that there is some absorption by $Te_2$ vapour at 325 nm, the wavelength designated for monitoring absorption of Cd vapour.

As described in reference [3], optical absorption is related to vapour pressure by the functional relationships:

$$\log P_{Cd} = -5300/T + 5.106 \quad (1)$$

$$\log P_{Te2} = -5960.2/T + 4.7192 \quad (2)$$

where P is pressure in atmospheres (atm) and T is temperature in degrees Kelvin (K). The optical density D for a given vapour species is generally given by the expression:

$$D = \log I_0/I = \log V_0/V \quad (3)$$

where $I_0$, $V_o$ and I, V are the optical intensity and the voltage measured by the photodetectors corresponding respectively to the reference beam and the measurement beam.

The optical densities $D=D_{Cd}$ and $D=D_{Te2}$ were measured as a function of temperature to determine the following specific forms of equation (3):

$$\log D_{Cd}(\text{atm}) = -5849.5/T(K) + 5.101 \text{ at a wavelength of 325 nm} \quad (4)$$

$$\log D_{Te2}(\text{atm}) = -5769.2/T(K) + 6.5819 \text{ at a wavelength of 442 nm} \quad (5)$$

Relations (1), (2), (4) and (5) can be combined to relate optical density to partial pressure. Namely, the following relationships connect the partial pressure $P_{Cd}$ to the optical density $D_{Cd}$ and the partial pressure $P_{Te2}$ to the optical density $D_{Te2}$:

$$\log P_{Cd} = 0.9061 \log D_{Cd} + 0.4842 \quad (6)$$

$$\log P_{Te2} = 1.0331 \log D_{Te2} - 2.0806 \quad (7)$$

The small absorption of $Te_2$ at 325 nm was also measured and taken into account. The absorption of Cd vapour at a 442 nm was negligible and not taken into account.

The heat treatment method and apparatus is now described with reference to a specific example of heat treatment of CdTe powder.

The quartz elements 1, 4 and 6 are etched, rinsed with water and ethanol, and dried in a clean oven. For degassing, elements 1 and 4 are then: (i) heated at 800° C. in oxygen, in order to remove organic contaminants; and (ii) heated at 1000° C. for at least 8 hours under vacuum in the configuration of FIG. 1. A vacuum better than $1 \times 10^{-3}$ Pa ($1 \times 10^{-5}$ mbar) is recommended. The quartz wool for the wadding 6 is separately treated according to the same two degassing steps.

The charge 5 is polycrystalline CdTe prepared according to the method and apparatus described in reference [7]. The polycrystalline CdTe is ground into a powder with grains of diameter less than 0.5 mm. The charge 5 is loaded into the chamber body 5. The plug 4 and wadding 6 are then inserted as described further above. In the experiments carried out, between 60–150 grammes of this material were introduced into the chamber body 1. However, any suitable amount could be considered.

The valve 10 is opened, and a turbomolecular pump of the vacuum system evacuates the chamber body 1 and the optical measurement cell 3 for at least 24 hours. This allows removal of most of the oxygen to prevent oxidation of the charge 5 during the high temperature treatment that is to follow.

Then, the temperature is raised to 300° C. for 3–4 hours in order to degas the system.

Then, $0.5 \times 10^5$ Pa (0.5 atm) of Ar plus 3% $H_2$ are introduced and the system is maintained at 300° C. for 3 hours. Since $H_2$ is strongly reactive it should serve to purge the system, eliminating impurities.

After cooling to room temperature, the purging procedure is carried out three times. Each time six-nine purity (6N) argon is introduced through valve 8 and the system is then evacuated through valve 10.

Then, 15,000 Pa (150 mbar) of argon (Ar) gas is introduced by valve 8. Alternatively, argon gas can be replaced with a mixture of Ar and $H_2$ in order to prevent any oxidation of the charge. The inert gas reduces the mean free path of the vapour molecules of Cd and $Te_2$, thus having the important effect of limiting the effusion of these species out of the zone of the chamber body 1 where the polycrystals are stored. This is important for facilitating the optical absorption measurements, which are easier to make accurately at higher pressures. In fact, varying the inert gas pressure can be used to control the rate of effusion. Increasing the inert gas pressure, slows the transport of the excess components through the plug 4 and wadding 6.

Typically, the heat treatment comprises a first heating phase, of about 2 hours, to reach an annealing temperature of 900° C. This temperature is intermediate between the melting point of the compound CdTe (about 1092° C.) on the one hand and the melting points of the elemental species Te (450° C.) and Cd (320° C.) on the other hand. The annealing temperature is preferably well above the respective melting points of the elemental constituents of the binary compound to increase the vapour pressures and the evaporation rates of any excess elemental components. An anneal temperature equal to at least the midway temperature between the melting point of the highest melting point elemental component of the compound and the melting point of the highest melting point is preferred. The midway temperature for CdTe would be 771° C., i.e. 450+(1092−450)/2.

While the charge 5 placed in Zone B is held at a temperature of about 900° C., the cell 3 in Zone A is held around 5° C. higher in temperature. At 900° C. any excess Cd or Te components of the CdTe exit in a liquid phase (see FIG. 2).

The liquid parts of the excess Cd or Te correspond to very high equilibrium vapour pressures, therefore Cd and Te evaporate very fast and create high vapour pressure inside the region of the chamber body 1 where the CdTe charge 5 is placed.

$Te_2$ vapour in equilibrium with stoichiometric CdTe at 900° C. has a pressure of about 500 Pa (5 mbar). $Te_2$ vapour in equilibrium with liquid Te at the same temperature reach vapour pressure of the order of atmospheres. Cd vapour in equilibrium with stoichiometric CdTe at 900° C. has a pressure of about 1000 Pa (10 mbar). Cd vapour in equilibrium with liquid Cd at the same temperature reach vapour pressure of the order of atmospheres. Consequently, if the charge is Te or Cd deviated, the sublimation of CdTe is inhibited. Moreover, the quantity of excess Cd that gives rise (following the approximate relation PV=nRT) to this equilibrium pressure depends upon the mass-to-volume ratio in the region of the chamber body 1 where the charge 5 is located. This means that, by increasing the mass-to-volume ratio, a smaller percentage deviation in Cd (or Te) gives rise to the equilibrium pressure of Cd (or Te) from CdTe. Since the sublimation of CdTe is inhibited, the effusive flux is dominated by the excess components.

Because of the difference of partial pressures existing on either side of the plug 4, i.e. between the region to the left of the plug 4 occupied by the charge 5 (higher partial pressures) and the region to the right of the plug 4 and wadding 6 (lower pressure), the excesses of Cd and/or Te spread as Cd and $Te_2$ vapours through to the right region of the chamber body 1 through the annular channel formed between the close-fitting inner surface of chamber body 1 and the outer surface of the plug 4, and through the wadding 6.

The inner and outer walls of the chamber body 1, plug 4 and wadding 6 thus act collectively as a barrier or effusive hole that limits the velocity of migration of the vapours away from the charge 5. This has the important effect of raising the pressure in the vicinity of the heated charge to inhibit excessive sublimation of the charge while excess components are being evaporated. Excess components are thus evaporated in a relatively high pressure atmosphere. The high pressure not only inhibits material loss through sublimation, but also facilitates the optical absorption measurements which become easier to make, and to make accurately, at higher pressures.

While the charge 5 is being heated at around 900° C., the vapour pressures of Cd and $Te_2$ are monitored. At this temperature, the liquid part of the excess component (Cd or Te) corresponds to a very high equilibrium vapour pressure. The excess components will therefore evaporate very fast and produce a high vapour pressure inside the chamber body 1. This high vapour pressure inhibits the CdTe sublimation, as previously mentioned.

The personal computer 20 evaluates from equations (4) and (5) the optical density $D_{Cd}$ for Cd vapour and the optical density $D_{Te2}$ for $Te_2$ vapour on the basis of the photodetector readings. The temperature of the charge is monitored by the signal from the thermocouple 24. The optical density $D_{Te2}$ is corrected in order to take in account the absorption of the light at 325 nm. Using the calculated values of the optical densities, $D_{Cd}$ and $D_{Te}$, the computer 20 then determines the pressures $P_{Cd}$ and $P_{Te2}$) by using the expressions (6) and (7). The Cd and $Te_2$ pressures were evaluated every 0.1 sec during the heat treatment.

Figure 4:
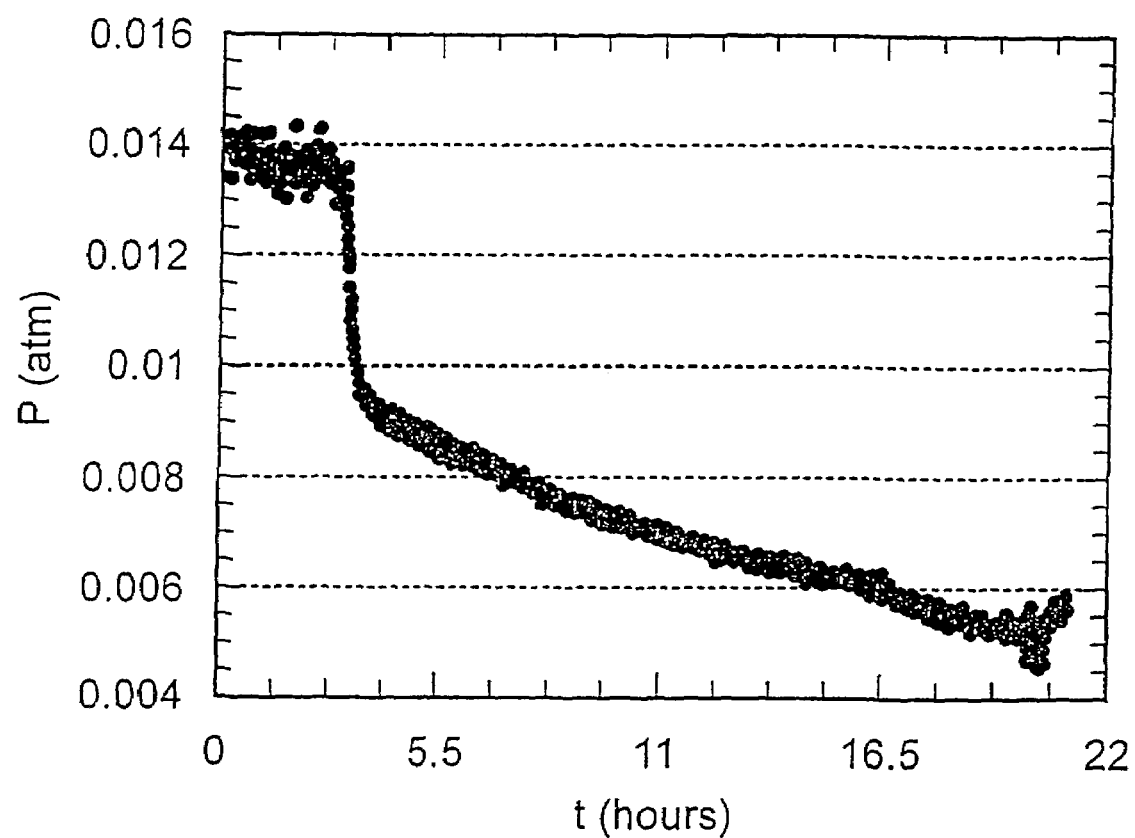
FIG. 4 shows measured partial pressure of $Te_2$ during heat treatment.

FIG. 4 shows the temporal evolution, t, of $Te_2$ vapour pressure, P, during the annealing at 900° C., as determined in real time during the anneal by the computer 20. As can be seen, initially the $Te_2$ vapour pressure is relatively high at approximately $0.014 \times 10^5$ Pa (0.014 atm). This high pressure exists for somewhat more than two hours without significant change. This is indicative of a charge having considerable excess Te, indeed so much that it is outside the solubility region of Te in CdTe and has precipitated out to form Te droplets. During this period, the pressure is dominated by evaporation of precipitated Te.

After the high pressure plateau, a fast decrease of the $Te_2$ vapour pressure is observed. The $Te_2$ vapour pressure falls from $0.015 \times 10^5$ Pa (0.014 atm) to about $0.009 \times 10^5$ Pa (0.009 atm) in about 50 minutes. The fast decrease is considered to be a transition as the precipitated Te is exhausted.

There then follows a gradual decrease in the $Te_2$ pressure over 17 or more hours from $0.009 \times 10^5$ Pa (0.009 atm) towards $0.006 \times 10^5$ Pa (0.006 atm) which is approximately 600 Pa (6 mbar). The significance of this pressure is that it corresponds to the vapour pressure of pure stoichiometric vapour ($P_{Cd}=2\ P_{Te2}$). The gradual pressure decrease is considered to result from a gradual refining of the stoichiometry of the charge material within the region of solubility of Te in CdTe.

The heat treatment is stopped at around 20 hours when the stoichiometric pressure of 500 Pa (5 mbar) is attained. This is ideal if the heat-treated charge is to be used as source material for growth of crystalline CdTe by physical vapour transport (PVT).

If the heat treatment were continued after reaching the pressure of stoichiometric vapour (500 Pa, i.e. 5 mbar, in the case of $Te_2$ vapour from CdTe), no further refinement would occur, only wasteful loss of material as in the prior art, where it is not possible to make any in situ measurement of the vapour pressure during heat treatment.

The in situ monitoring of vapour pressure during the anneal also provides the possibility of stopping the heat treatment at any target vapour pressure above the stoichiometric pressure. In general, it is expected that the vapour pressure of a relevant gas species associated with many other compounds will show the same basic functional form as illustrated in FIG. 4. Namely, after a compound has become free of precipitates, there will be a gradual pressure reduction from an elevated pressure to a stoichiometric pressure. The in situ measured pressure can thus be presumed to correlate directly with the stoichiometry of the charge during this heat-treatment period. Consequently, with the method and apparatus described herein it is possible to stop the heat treatment to produce a compound of a desired level of deviation from perfect stoichiometry. In other words, it becomes possible to stop the process of heat treatment at a target vapour pressure to provide material having a reproducible stoichiometric composition.

Perfect stoichiometry is often, but not always, what is desired. For example, there are some applications for which non-stoichiometric CdTe is required and the present apparatus and method can provide such material. As described in reference [5] the conductivity of CdTe is correlated to its stoichiometry. The present method and apparatus will thus allow CdTe of a desired conductivity type or value range to be provided The heat treatment method and apparatus thus allows an exact determination of the time at which the heat treatment is best stopped. This can be effected simply by switching-off the heating coils and waiting the cooling of the charge, or by removal of the heat treatment chamber from the furnace.

It has been observed that much of the Cd and $Te_2$ lost from the charge during the heat treatment, will have condensed in the wadding 6. Consequently, in order to reduce contamination of the heat-treated CdTe, the chamber body 1 can be severed in the region of the plug 4 to separate off the wadding 6 prior to removal of the heat-treated charge 5.

To assess the success of the above-described heat treatment in achieving near-perfect stoichiometry CdTe, mass transport experiments were carried out. It is known from reference [1] that mass transport of CdTe in a given thermal gradient is a function of the stoichiometry deviation. The heat-treated CdTe was placed into a closed quartz ampoule. Mass transport experiments were then carried out in a configuration similar to the one described in reference [1]. Mass transport never failed to take place for any of the tested samples. According to reference [1] (see page 556 thereof), mass transport will only occur if the CdTe source material is deviated by less than 0.04 mole % in Te or less than 0.01 mole % in Cd. It can therefore be inferred that the heat-treated CdTe obtained from the above-described method and apparatus was in all cases highly stoichiometric.

The heat-treated CdTe was then used as source material for growing crystalline CdTe by PVT, as now described with reference to FIG. 5 and FIG. 6.

Figure 5:
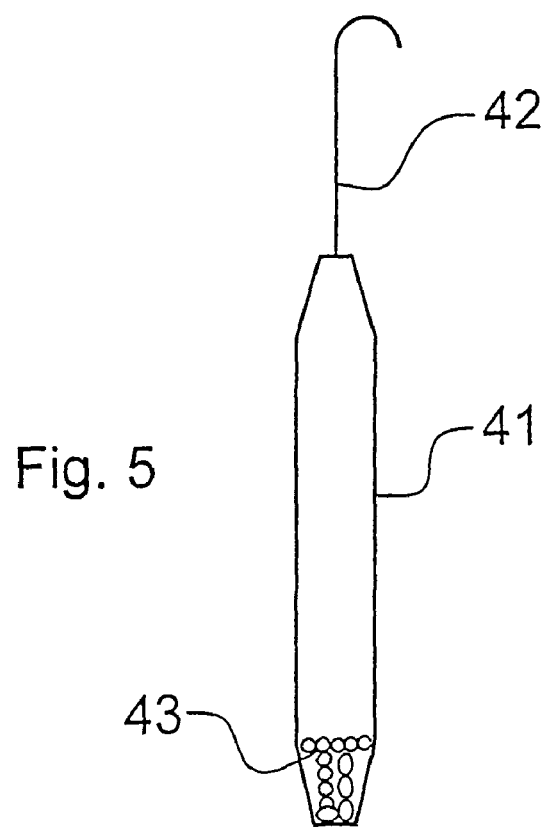
FIG. 5 shows a quartz ampoule and pulling rod for growing a crystal using material processed in the system of FIG. 3.

FIG. 5 shows an amount of heat-treated CdTe material 43 after its introduction in the base of a quartz ampoule 41. The ampoule 41 was connected to a vacuum system and sealed under a vacuum of less than $10^{-3}$ Pa ($10^{-5}$ mbar). The ampoule 41 was then introduced into a vertical furnace for PVT growth connected to a pulling rod 42.

Figure 6:
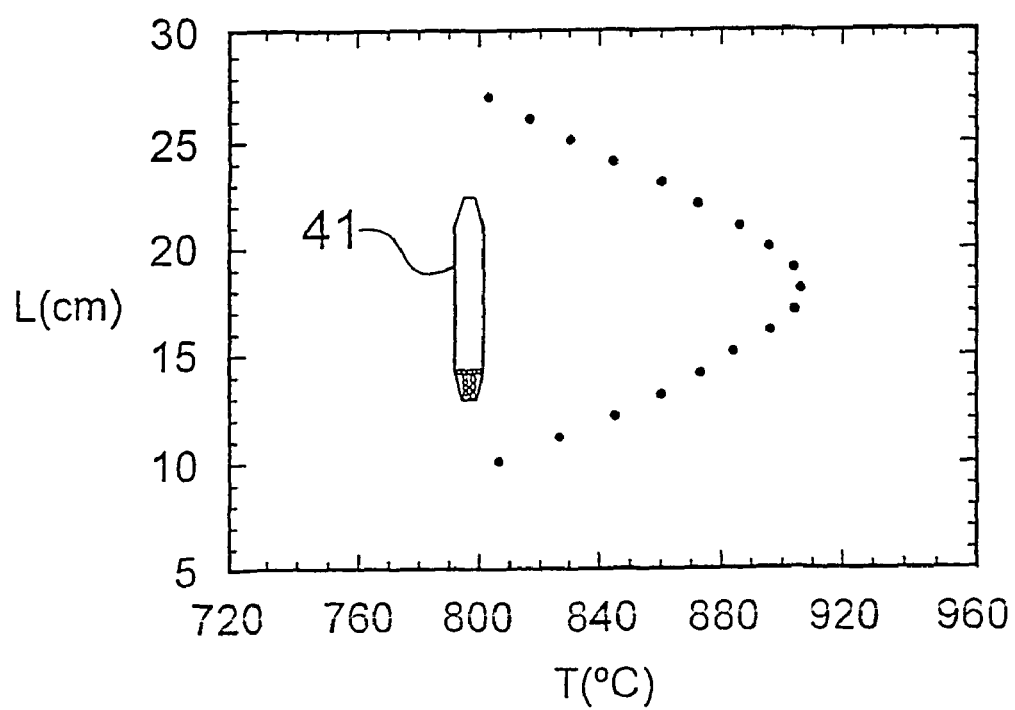
FIG. 6 shows the temperature profile lengthwise along a PVT growth oven.

FIG. 6 shows the thermal profile lengthwise along the PVT growth furnace (L v. T), with the ampoule 41 schematically shown in the plot at its initial position. The ampoule 41 was then moved slowly upwards in the furnace by the pulling rod 42 so that it experiences a rise and fall in temperature defined by the temperature profile along the furnace. At the end of the growth process, the furnace was slowly cooled.

Examination showed that the PVT-grown CdTe had large single grains, indicating qualitatively that the growth was high quality. Resistivity measurements were then carried out to provide a quantitative measure of the material quality.

In all, five PVT growths of CdTe were performed, providing the following resistivity data:

| Sample | Resistivity (Ohm.cm) |
|--------|----------------------|
| 1 | $5 \times 10^8$ |
| 2 | $4 \times 10^9$ |
| 3 | $2.5 \times 10^8$ |
| 4 | $1.5 \times 10^8$ |
| 5 | $2 \times 10^8$ |

As can be seen from the table, all samples have high resistivity values, indicating low defect concentrations and overall good quality.

Moreover, in order to provide an evaluation of the stoichiometry of the treated material, the equilibrium pressure of Cd and $Te_2$ vapours were measured at 870° C. before and after heat treatment.

A first sample was of commercially available CdTe acquired from ESPI, US. Before heat treatment, the sample had a measured $Te_2$ pressure of 4000 Pa (40 mbar). After heat treatment, the measured $Te_2$ pressure was 450 Pa (4.5 mbar).

A second sample was CdTe synthesised by the present inventors. Before heat treatment, the sample had a measured $Te_2$ pressure of 1400 Pa (14 mbar). After heat treatment, the measured $Te_2$ pressure was 450 Pa (4.5 mbar).

The $Te_2$ equilibrium pressure for both samples after heat treatment is thus close to that expected for perfect stoichiometry (see reference [10], in particular equation 8 at page 196).

Figure 7:
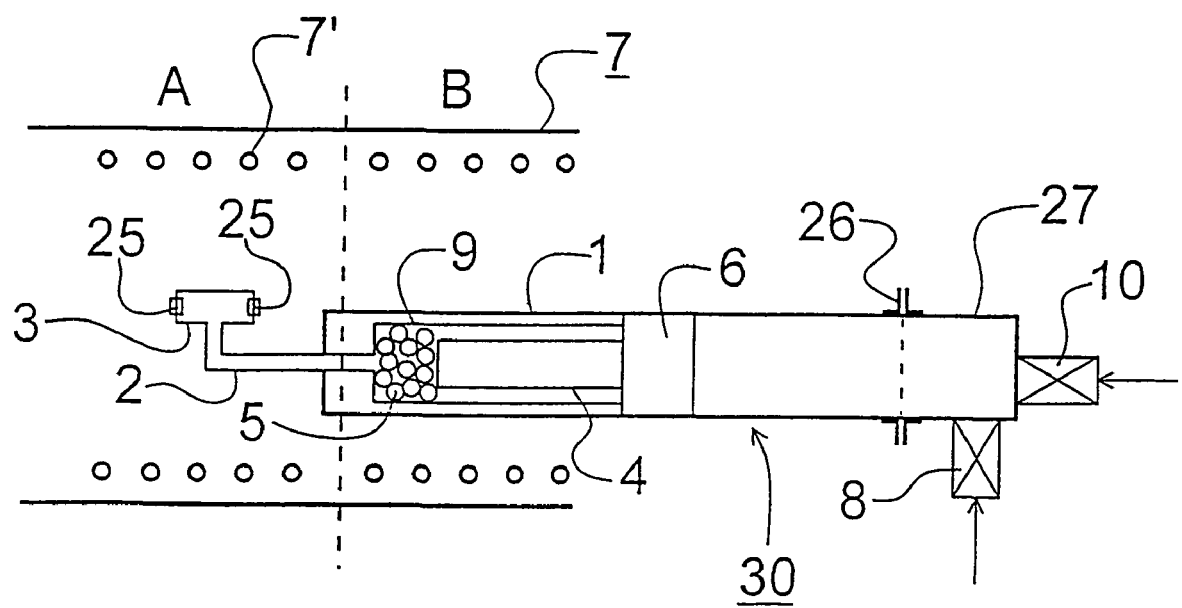
FIG. 7 shows an alternative heat treatment chamber arranged in a two-zone furnace.

FIG. 7 shows an alternative heat treatment chamber 30 arranged in a two-zone furnace 7 with inductive or resistive heating coils 7'. Many of the design details will be understood from the above description of the heat treatment chamber of FIG. 1, so the following description is relatively brief. The alternative design has a quartz inner sleeve 9 for containing a charge 5. The inner sleeve 9 is closed at one end save for the opening of a capillary tube 2 leading to an optical measurement cell 3 with optical access windows 25. The inner sleeve 9 is open at its other end for receiving a plug 4 in close fit. Quartz wadding 6 is packed behind the plug 4 and tube 9 within a quartz outer sleeve 1. The outer sleeve 1 extends in one direction beyond the closed end of the inner sleeve 9 and forms a vacuum-tight seal around the capillary tube 2. The outer sleeve 1 extends in the other direction to a vacuum flange 26. The vacuum flange 26 abuts a further extension sleeve 27 which has first and second valves 8 and 10 therein, respectively for admission of inert gas and for pumping with a vacuum pump. In use, after conclusion of heat treatment, the extension sleeve 27 can be removed by releasing the vacuum flange 26. The wadding 6, contaminated with depositions of evaporated excess components, can then be extracted. A separate sawing action is thus avoided, allowing parts of the heat treatment chamber to be reused. The inner sleeve 9 with heat-treated charge 5 can then be extracted. To do this, the capillary tube 2 has to be cut. Alternatively, the outer sleeve 1 can be cut along the dashed line of FIG. 3.

Although described above with specific reference to CdTe, the controlled heat treatment method and apparatus could be used for treating a wide variety of compound materials, such as IV-IV, III-V or II-VI compounds. Examples of IV-IV compounds are SiGe and SiC. Examples of III-V compounds are GaAs, InP, GaInAs and GaInAsP. Examples of some other II-VI binary compounds are ZnTe, CdSe, CdS, ZnSe, ZnS, and associated ternary or quaternary compounds. In each case a convenient temperature for the heat treatment should be readily ascertainable.

Generally, for binary compounds, the partial pressure of only one elemental vapour species needs to be measured, since the other can then be inferred. For ternary compounds, the partial pressures of at least two elemental vapour species will need to be made. For quaternary, compounds the partial pressures of at least three elemental vapour species will need to be measured.

REFERENCES

1. Yellin & Szapiro: Journal of Crystal Growth, vol. 69, pages 555–560 (1984)
2. Su et al: Journal of Crystal Growth, vol. 183, pages 519–524 (1998)
3. Carles et al: Journal of Crystal Growth, vol. 174, pages 740–745 (1997)
4. Mullins et al: Journal of Crystal Growth, vol. 208, pages 211–218 (2000)
5. Berdling: Applied Physics Letters, vol. 74, pages 552–554 (1999)
6. Laasch et al: Journal of Crystal Growth, vol. 174, pages 696–707 (1997)
7. EP 98124186.2.
8. Giebel et al: Journal of Crystal Growth, vol. 86, pages 386–390 (1988)
9. Mochizuki: Journal of Crystal Growth, vol. 73, pages 510–514 (1985)
10. De Largy et al: Journal of Crystal Growth, vol. 61, pages 194–198 (1983)

The invention claimed is:

1. A method of heat treatment of a charge of compound material comprising a plurality of n atomic species to remove an excess of at least one of the atomic species, the method comprising:

(a) heating the charge to a temperature above a melting temperature of at least one of the atomic species and below the melting temperature of the compound;
(b) monitoring a gas pressure associated with one of the atomic species during the heating; and
(c) controlling the heating in response to the monitored gas pressure.

2. A method according to claim 1, wherein the heat treatment is stopped when the monitored gas pressure reaches a desired target value.

3. A method according to claim 2, wherein the target value corresponds to a stoichiometric balance between the atomic species in the charge of material.

4. A method according to claim 2, wherein the target value is defined in terms of a gas pressure of a further one of the atomic species.

5. A method according to claim 4, further comprising:
monitoring the gas pressure of the further one of the atomic species during the heating.

6. A method according to claim 1, wherein an inert gas is applied to the charge to inhibit loss of the compound material.

7. A method according to claim 1, wherein the charge is at least partially enclosed to inhibit loss of the compound material and to elevate the gas pressure for the monitoring.

8. A method according to claim 1, wherein the gas pressure is monitored by an optical absorption method.

9. A method of growing a crystalline compound, comprising:
annealing a charge of material comprising a plurality of n atomic species according to the heat treatment method of any one of the preceding claims;
placing the annealed charge into a growth chamber; and
growing a crystalline compound incorporating material from the annealed charge.

10. A method of fabricating a device, comprising:
growing a crystalline compound according to claim 9; and
fabricating a device from the crystalline compound.

11. A device comprising a crystalline compound fabricated according to claim 9.

12. A heat treatment chamber comprising:
a treatment region containing a charge of compound material comprising a plurality of n atomic species, each atomic species being associated with at least one gas species;
a gas permeable barrier at least partially enclosing the treatment region, the barrier being sufficiently permeable to passage of the gas species from the charge, but sufficiently resistive to elevate the gas vapour pressure of at least one of the gas species in the treatment region;
a measurement chamber arranged in gaseous communication with the treatment region of the heat treatment chamber.

13. A heat treatment apparatus comprising:
a heat treatment chamber having a treatment region in which a charge of compound material comprising a plurality of n atomic species can be placed for heat treatment, each atomic species being associated with at least one gas species, the treatment region being at least partially enclosed by a gas permeable barrier for elevating the gas vapour pressure of at least one of the gas species in the treatment region;
a measurement device for measuring gas vapour pressure of at least one of the gas species in the treatment region;
a furnace for heating the heat treatment chamber; and
a control device operable to control the furnace responsive to a vapour pressure signal of at least one of the gas species from the measurement device.

14. A heat treatment apparatus according to claim 13, wherein the measurement device includes a measurement chamber in gaseous communication with the treatment region of the heat treatment chamber.

15. A heat treatment apparatus according to claim 14, wherein the furnace has first and second zones maintainable at different temperatures and the measurement chamber is arranged in the first zone and the heat treatment chamber is arranged in the second zone.

16. A heat treatment apparatus according to claim 14, wherein the measurement chamber includes an optical access and the measurement device is operable to measure optical absorption of at least one of the gas species in the measurement chamber.

17. A heat treatment apparatus according to claim 14, wherein the control device is operable to maintain the heat treatment chamber at an elevated temperature until a target value of the gas pressure is measured by the measurement device.

18. A heat treatment apparatus according to claim 17, wherein the target value is defined by a vapour pressure of at least one of the gas species.

19. A heat treatment apparatus according to claim 17, wherein the target value is defined by a ratio of vapour pressures of two of the gas species.

* * * * *